United States Patent
Strukov et al.

(10) Patent No.: US 8,373,440 B2
(45) Date of Patent: Feb. 12, 2013

(54) THREE DIMENSIONAL MULTILAYER CIRCUIT

(75) Inventors: Dmitri Borisovich Strukov, Menlo Park, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/256,233

(22) PCT Filed: Apr. 6, 2009

(86) PCT No.: PCT/US2009/039666
§ 371 (c)(1),
(2), (4) Date: Sep. 13, 2011

(87) PCT Pub. No.: WO2010/117355
PCT Pub. Date: Oct. 14, 2010

(65) Prior Publication Data
US 2012/0001654 A1    Jan. 5, 2012

(51) Int. Cl.
*H03K 19/173* (2006.01)
(52) U.S. Cl. .......................................... 326/38; 326/103
(58) Field of Classification Search ............... 326/37–41, 326/101–103
See application file for complete search history.

(56) References Cited

U.S. PATENT DOCUMENTS

| | | | |
|---|---|---|---|
| 3,318,993 A | 5/1967 | Beelitz | |
| 4,980,034 A | 12/1990 | Volfson et al. | |
| 5,640,761 A | 6/1997 | DiStefano et al. | |
| 6,735,104 B2 | 5/2004 | Scheuerlein | |
| 6,906,940 B1 | 6/2005 | Lue | |
| 6,965,137 B2 | 11/2005 | Kinney et al. | |
| 6,992,255 B2 | 1/2006 | Oprysko et al. | |
| 7,112,815 B2 | 9/2006 | Prall | |
| 7,157,305 B2 | 1/2007 | Prall | |
| 7,408,212 B1 | 8/2008 | Luan | |
| 2005/0067620 A1 | 3/2005 | Chan | |
| 2005/0167787 A1 | 8/2005 | Fricke et al. | |
| 2008/0090337 A1 | 4/2008 | Williams | |
| 2011/0076810 A1* | 3/2011 | Xia et al. ...................... | 438/129 |
| 2012/0032345 A1* | 2/2012 | Strukov et al. ............... | 257/774 |
| 2012/0098566 A1* | 4/2012 | Robinett ........................ | 326/38 |

OTHER PUBLICATIONS

Lee, M. J.; "Stack Friendly All-Oxide 3D RRAM using GaInZnO Peripheral TFT realized over Glass Substrates"; Dec. 2008; p. 1-4; IEEE; San Francisco, CA, U.S.A; http://ieeexplore.ieee.org/xpl/freeabs_all.jsp?arnumber=4796620.

Snider, Gregory S.; "Nano/CMOS Architectures Using a Field-Programmable Nanowire Interconnect"; Jan. 3, 2007; p. 1-11; IOP Publishing Ltd; United Kingdom; http://www.iop.org/EJ/article/0957-4484/18/3/035204/nano7_3_035204.pd.

Snider, Greg S., "Cortical Computing with Memristive Nanodevices", Scidac REview Winter 2008, pp. 58-65.

* cited by examiner

*Primary Examiner* — Don Le

(57) ABSTRACT

A three dimensional multilayer circuit includes a via array made up of a set of first vias and a set of second vias and an area distributed CMOS layer configured to selectively address said first vias and said second vias. At least two crossbar arrays overlay the area distributed CMOS layer. These crossbar arrays include a plurality of intersecting crossbar segments and programmable crosspoint devices which are interposed between the intersecting crossbar segments. The vias are connected to the crossbar segments such that each programmable crosspoint devices can be uniquely accessed using a first via and a second via.

15 Claims, 12 Drawing Sheets

THREE DIMENSIONAL MULTILAYER CIRCUIT

BACKGROUND

In the past decades, the semiconductor industry has been improving the performance and density of integrated circuits primarily by shrinking the size of the electronic elements within the circuits. However, a number of barriers are becoming evident which increase the difficulty of making further reduction to the size of these elements. One potential solution for increasing the performance and planar density of integrated circuits is to create three dimensional circuits which contain multiple layers of interconnected circuitry.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

In the past decades, the semiconductor industry has been improving the performance and density of integrated circuits primarily by shrinking the size of the electronic elements within the circuits. However, a number of barriers are becoming evident which increase the difficulty of making further reduction to the size of these elements. One potential solution for increasing the performance and planar density of integrated circuits is to create three dimensional circuits which contain multiple layers of interconnected circuitry.

The three dimensional multilayer circuit described below is a hybrid of CMOS circuitry and crossbar arrays which provides higher density in digital memories, dramatically improves the density of field programmable logic, and has significant applications in bio-inspired adaptive circuitry. According to one illustrative embodiment, a number of crossbar arrays are stacked vertically above an area distributed CMOS circuit. Connections are made between the various arrays and the CMOS circuit with vias. By interposing a lateral wiring layer between crossbars, it is possible to laterally shift the connecting point to a set of vias, thus enabling access to all connectivity domains in every crossbar array. This allows each programmable crosspoint device in each crossbar array to be uniquely addressed. In an alternative embodiment with a limited number of crossbar arrays, the connectivity domains can be shifted by simple symmetry operations without any intermediate wiring layers.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

Figure 1A:
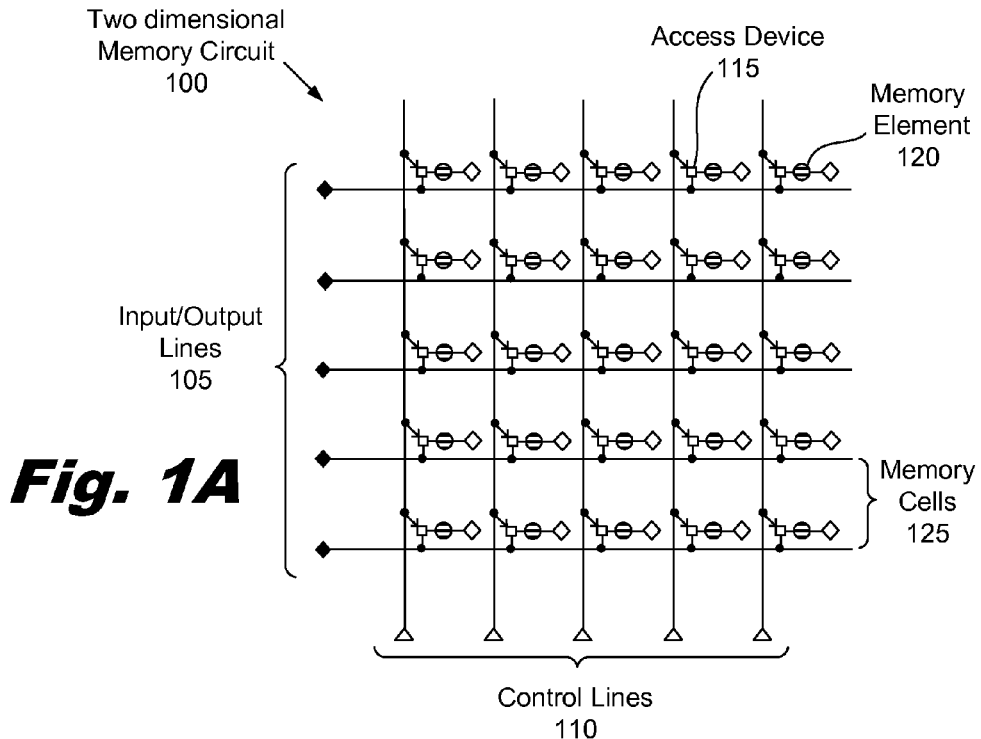
FIG. 1A is a diagram of an illustrative embodiment of a two dimensional memory circuit, according to one embodiment of principles described herein.

FIG. 1A is a diagram of an illustrative embodiment of a two dimensional memory circuit (100). The memory circuit (100) includes a number of data input/output lines (105) and a number of control lines (110). These lines (105, 110) are used to read and write data to a number of memory cells (125). Within each memory cell (125) is an access device (115) and a memory element (120). The access device (115) selectively controls access to the memory element (120). For example, the access device (115) may be a transistor or other switching device. The memory device (120) has at least two states which can be used to store digital data.

To access a given memory element (120), a voltage is placed on a control line (110). The voltage is received by each access device (115) attached to the control line (110) which corresponds to a column in the memory array. All of these access devices (115) then connect their corresponding memory elements (120) to the input/output lines (105). A voltage is then applied to a selected input/output line (105) which corresponds to the row of the desired memory element (120). In some embodiments, the current flow through the memory element (120) is then measured to determine the state of the memory element (120). Consequently, for N control lines (110) and N input/output lines (105), $N^2$ memory cells (125) can be addressed.

FIG. 1A is only one illustrative example of a typical array topology used for various memories which renders a simple and compact circuit layout. The memory elements (120) may vary according to the type of memory, e.g., capacitor, variable capacitor, floating gate transistor, four transistor feed back loop circuit, or magnetic tunnel junction in commercialized DRAM, FeRAM, NOR flash, SRAM or MRAM, technologies, correspondingly. The read/write operations may also not be the same for these types of memories but in general, e.g., read involves sensing either the charge of a particular memory element or passing current through the memory element.

Figure 1B:
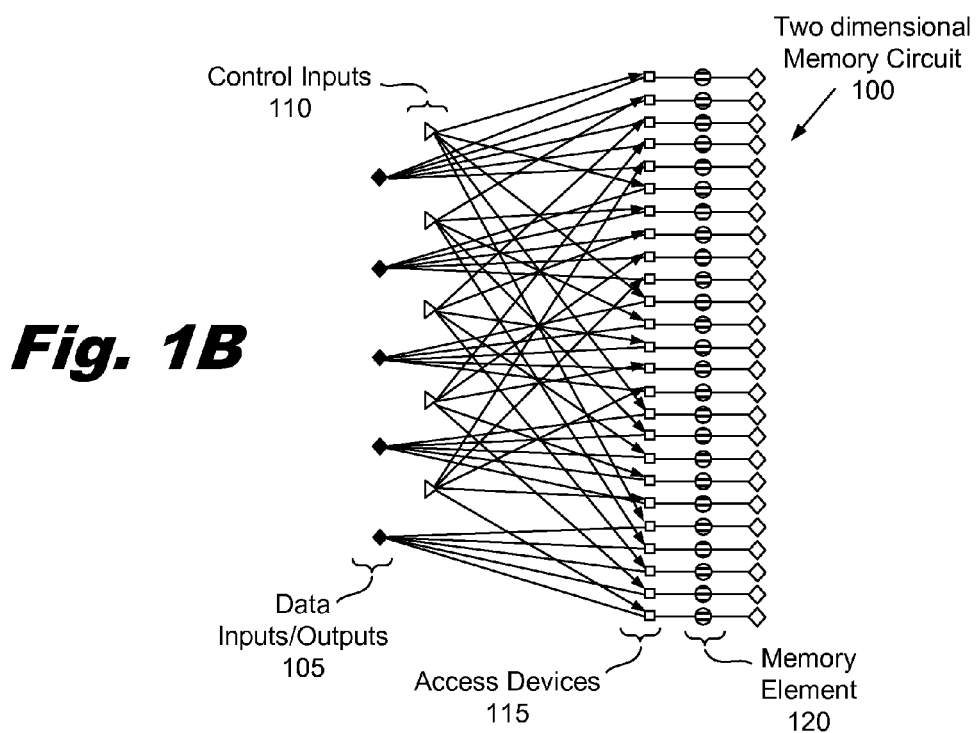
FIG. 1B is a graphical representation of interconnections within the illustrative two dimensional memory circuit diagram of FIG. 1A, according to one embodiment of principles described herein.

FIG. 1B is a graphical representation of interconnections within the illustrative two dimensional memory circuit of FIG. 1A. As illustrated in FIG. 1B, each unique combination of an input/output line (105) and control line (110) provides access to a particular memory element (120) through an access device (115).

Figure 2A:
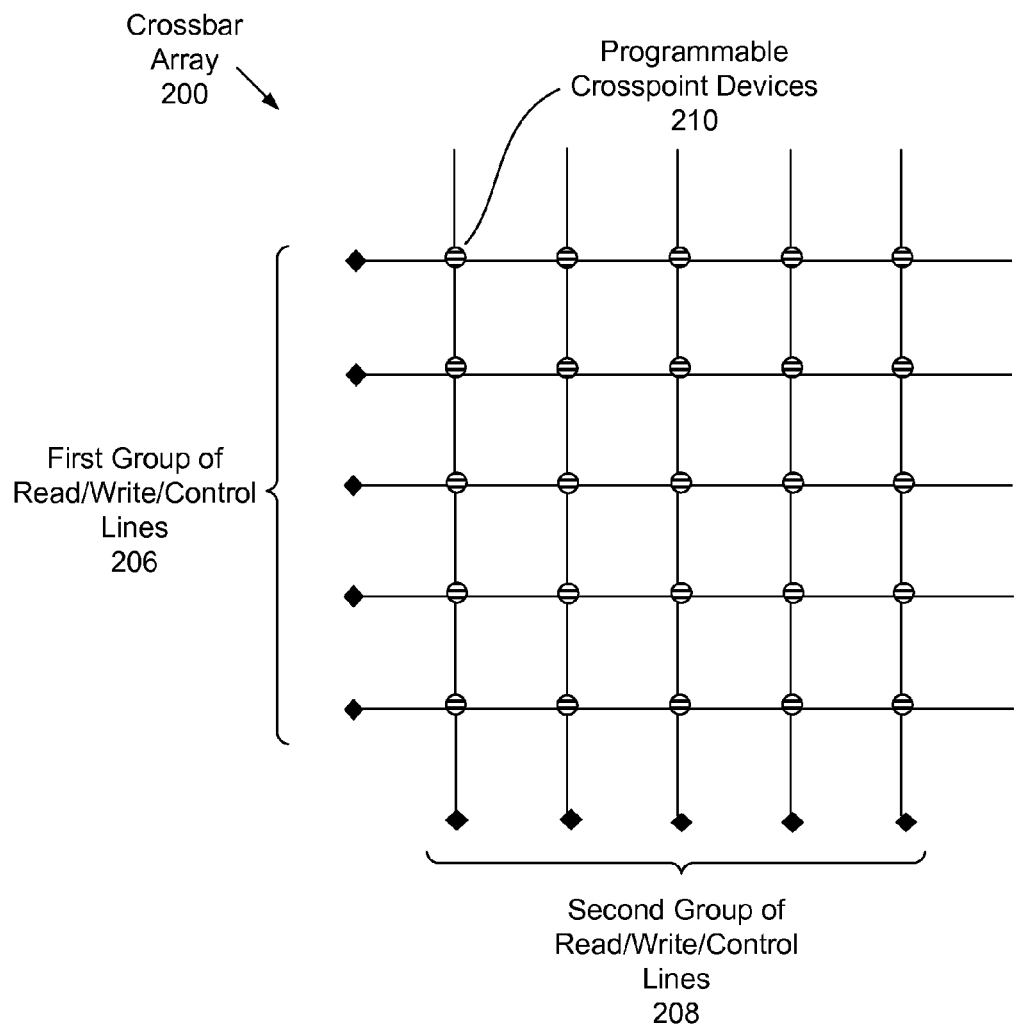
FIG. 2A is a diagram of a crossbar array, according to one embodiment of principles described herein.

FIG. 2A is a diagram of a crossbar array (200). The crossbar array (200) includes a first group of read/write/control lines (206) which are generally parallel. A second group of read/write/control lines (208) are perpendicular to the first group (205) and intersect the first group of lines (206). According to one illustrative embodiment, programmable crosspoint devices (210) are formed between intersecting lines. The programmable crosspoint devices (210) combine the functionality of the access device (115, FIG. 1A) and the memory element (120, FIG. 1A). By combining these two components into a single component, the crossbar array (200) can be denser and/or occupy less planar area than the conventional memory array illustrated in FIGS. 1A and 1B.

According to one illustrative embodiment, the programmable crosspoint devices (210) are memristive devices. Memristive devices exhibit a "memory" of past electrical conditions. For example, a memristive device may include a matrix material which contains mobile dopants. These dopants can be moved within a matrix to dynamically alter the electrical operation of an electrical device. The motion of dopants can be induced by the application of a programming electrical voltage across a suitable matrix. The programming voltage generates a relatively high electrical field through the memristive matrix and alters the distribution of dopants within the matrix. After removal of the electrical field, the location and characteristics of the dopants remain stable until the application of another programming electrical field. These changing dopant configurations within a matrix produce changes in the electrical resistance or other characteristics of the device.

The memristive device is read by applying a lower reading voltage which allows the internal electrical resistance of the memristive device to be sensed but does not generate a high enough electrical field to cause significant dopant motion. According to one illustrative embodiment, the memristive device exhibits a rectifying behavior similar to Schottky diode. The state of the memristive device can be read by applying a full forward voltage bias across specified junction while reverse biasing other memristive devices in the array to suppress leakage currents.

Figure 2B:
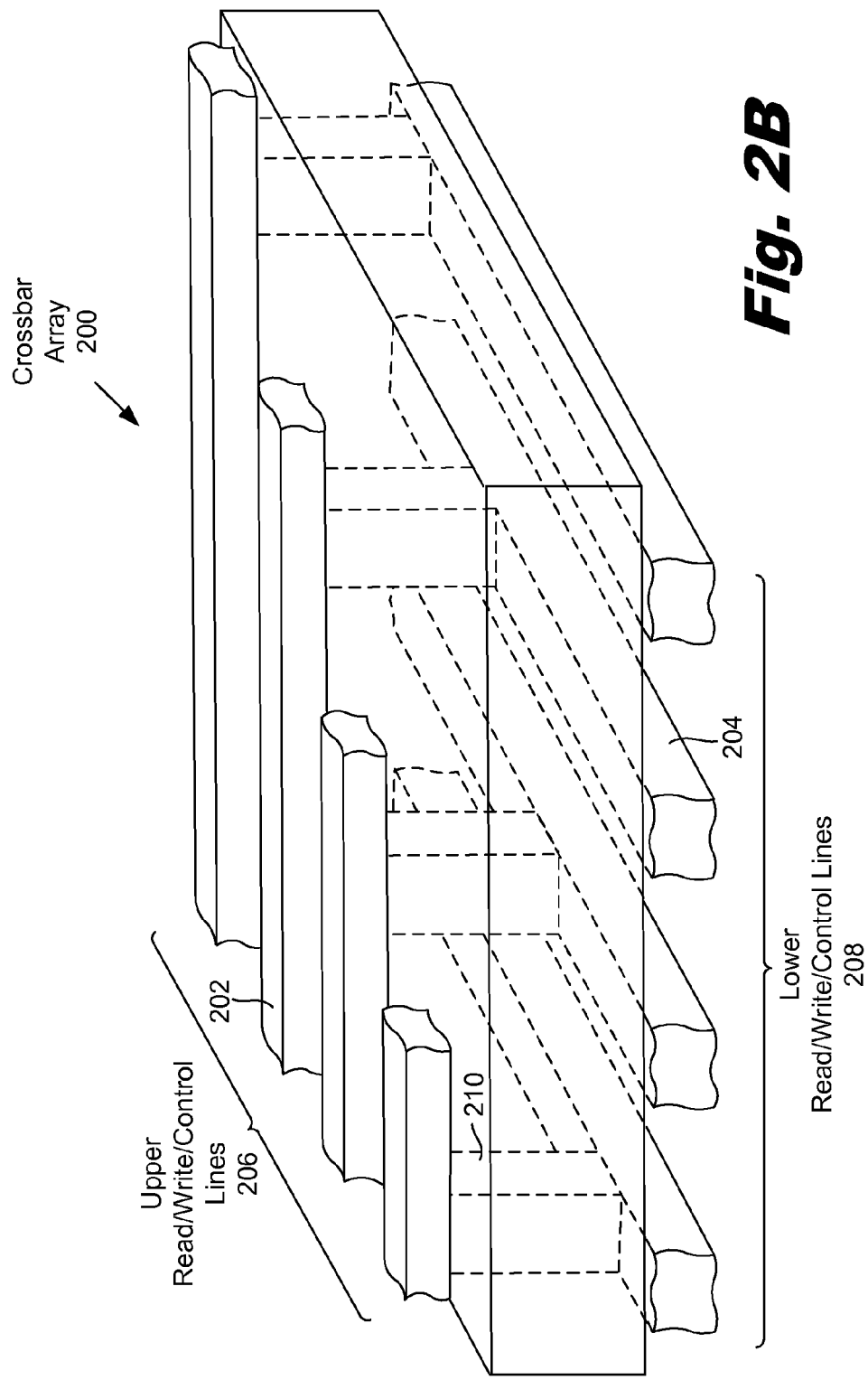
FIG. 2B is a perspective view of a crossbar array, according to one embodiment of principles described herein.

FIG. 2B shows an isometric view of an illustrative crossbar array (200). As discussed above, the crossbar array (200) is composed of a lower layer of approximately parallel nanowires (208) that are overlain by an upper layer of approximately parallel nanowires (206). The nanowires of the upper layer (206) are roughly perpendicular, in orientation, to the nanowires of the lower layer (208), although the orientation angle between the layers may vary. The two layers of nanowires form a lattice, or crossbar, in which each nanowire of the upper layer (206) overlies all of the nanowires of the lower layer (208). According to one illustrative embodiment, the memristive crosspoint devices (210) are formed between the crossing nanowires at these intersections. Consequently, each wire (202) in the upper layer (206) is connected to every wire in the lower layer (208) through a memristive crosspoint devices and visa versa.

These memristive crosspoint devices (210) may perform a variety of functions including providing programmable switching between the nanowires. Because every wire in the first layer of nanowires (208) intersects each wire in the second layer of nanowires (206), placing a memristive junction at each intersection allows for any nanowire in the lower layer (208) to be connected to any wire in the upper layer (206).

According to one illustrative embodiment, the nanowire crossbar architecture (200) may be used to form a nonvolatile memory array. Each of the memristive crosspoint devices (210) may be used to represent one or more bits of data. For example, in the simplest case, memristive crosspoint devices (210) may have two states: a conductive state and a nonconductive state. The conductive state may represent a binary "1" and the nonconductive state may represent a binary "0", or visa versa. Binary data can be written into the crossbar architecture (200) by changing the conductive state of the memristive crosspoint devices (210). The binary data can then be retrieved by sensing the state of the memristive crosspoint devices (210).

Although individual nanowires (202, 204) in FIG. 2B are shown with rectangular cross sections, nanowires can also have square, circular, elliptical, or more complex cross sections. The nanowires may also have many different widths or diameters and aspect ratios or eccentricities. The term "nanowire crossbar" may refer to crossbars having one or more layers of sub-microscale wires, microscale wires, or wires with larger dimensions, in addition to nanowires.

The layers may be fabricated using a variety of techniques including conventional photolithography as well as mechanical nanoimprinting techniques. Alternatively, nanowires can be chemically synthesized and can be deposited as layers of approximately parallel nanowires in one or more processing steps, including Langmuir-Blodgett processes. Other alternative techniques for fabricating nanowires may also be employed, such as interference lithography. Many different types of conductive and semi-conductive nanowires can be chemically synthesized from metallic and semiconductor substances, from combinations of these types of substances, and from other types of substances. A nanowire crossbar may be connected to microscale address-wire leads or other electronic leads, through a variety of different methods in order to incorporate the nanowires into electrical circuits.

The example above is only one illustrative embodiment of a crossbar array (200). A variety of other configurations could be used. For example, the crossbar array (200) can incorporate memristive crosspoint devices (210) which have more than two states. In another example, crossbar architecture can be used to form implication logic structures and crossbar based adaptive circuits such as artificial neural networks.

According to one illustrative embodiment, a crossbar memory array or other memristive device is integrated into complimentary metal-oxide-semiconductor (CMOS) or other conventional computer circuitry. This CMOS circuitry can provide additional functionality to the memristive device such as input/output functions, buffering, logic, or other functionality.

Figure 3A:
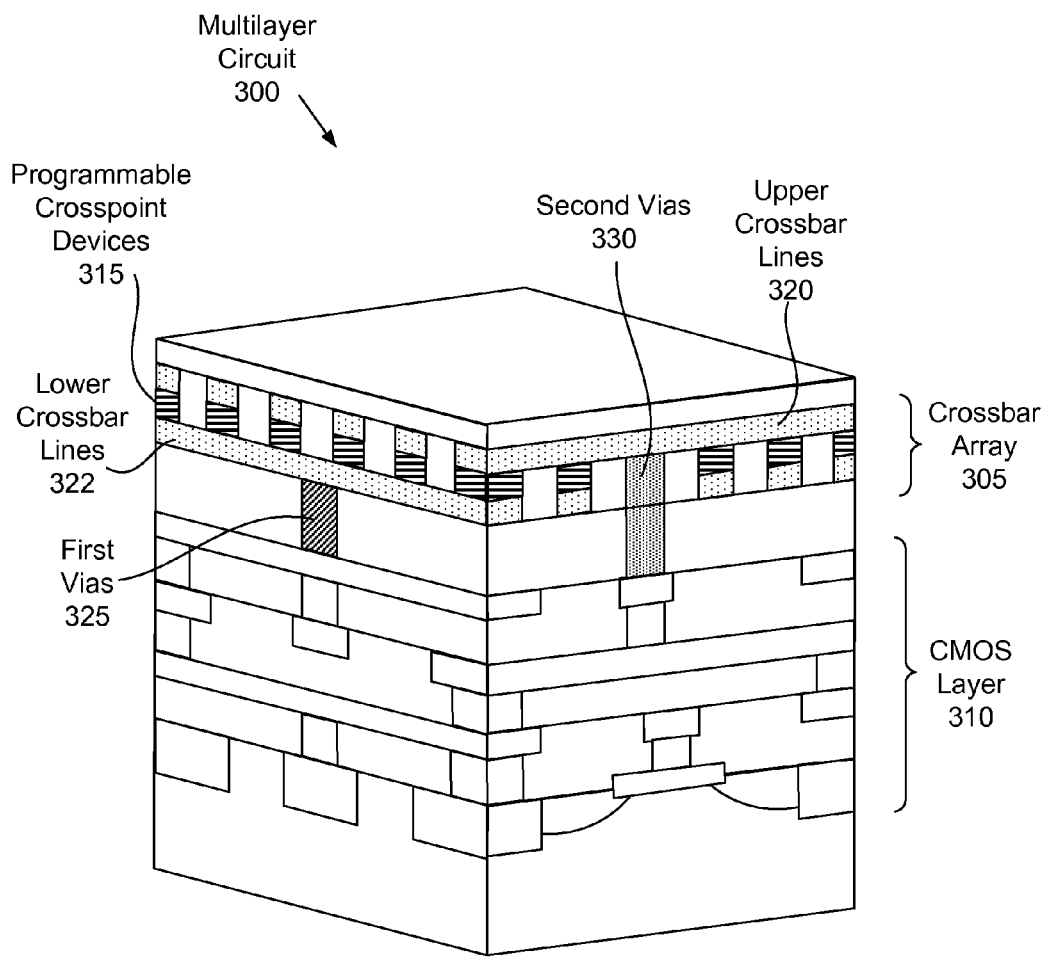
FIG. 3A is a diagram showing a cross-section of an illustrative multilayer circuit which includes a crossbar array and a complimentary metal-oxide-semiconductor (CMOS) layer, according to one embodiment of principles described herein.

FIG. 3A is a diagram showing an illustrative three dimensional multilayer circuit (300) which includes a CMOS layer (310) and an overlying crossbar array (305). As used in the specification and appended claims, a crossbar array includes a set of upper crossbar wires, a set of lower crossbar wires which intersect the upper crossbar wires at a non-zero angle, and programmable crosspoint devices interposed between the wires at the intersections. For example, the crossbar array (305) contains a set of upper crossbar wires (320), a set of lower crossbar wires (322), and a number of programmable crosspoint devices (315) interposed between the upper crossbar wires (320) and the lower crossbar wires (322). The crossbar array (305) is electrically connected to the underlying CMOS layer (310) by two groups of vias (325, 330). A first group of vias (325) connects to the lower crossbar lines (322) and a second group of vias (330) connects to the upper crossbar lines (320).

The CMOS layer (310) illustrated in FIG. 3A is "area distributed" rather than "peripherally distributed." Area distributed CMOS circuitry typically contacts the target circuitry over its bottom surface. The area distributed CMOS circuitry has several distinct advantages over contacting the target circuitry only around its periphery. In peripherally distributed CMOS circuitry, the density at which the CMOS circuitry can be packed around the target circuit can become a limiting factor in the circuit layout. Additionally, peripherally distributed CMOS circuitry can produce a combined circuit which occupies a large planar area, with long control and input/output lines. This leads to large values of line capacitance and resistance, which makes the write and read functions slow and energy intensive.

In contrast, area distributed CMOS circuitry typically underlies the target circuitry and can occupy as much room as the target circuit without increasing the required planar area of the combined circuit. Additionally, by connecting the CMOS circuitry to the overlying target circuit using vias, long connection traces are avoid. By avoiding long connection traces which are inherent in peripherally distributed configurations, the planar size and line capacitances of the circuit can be minimized. In particular, the nanowire length for area distributed interface is significantly reduced. This makes nanowire capacitance and resistance smaller, which makes write and read functions faster and lower energy, as well as reduces the number of devices connected to each nanowire thus decreasing possible leakage current.

Figure 3B:
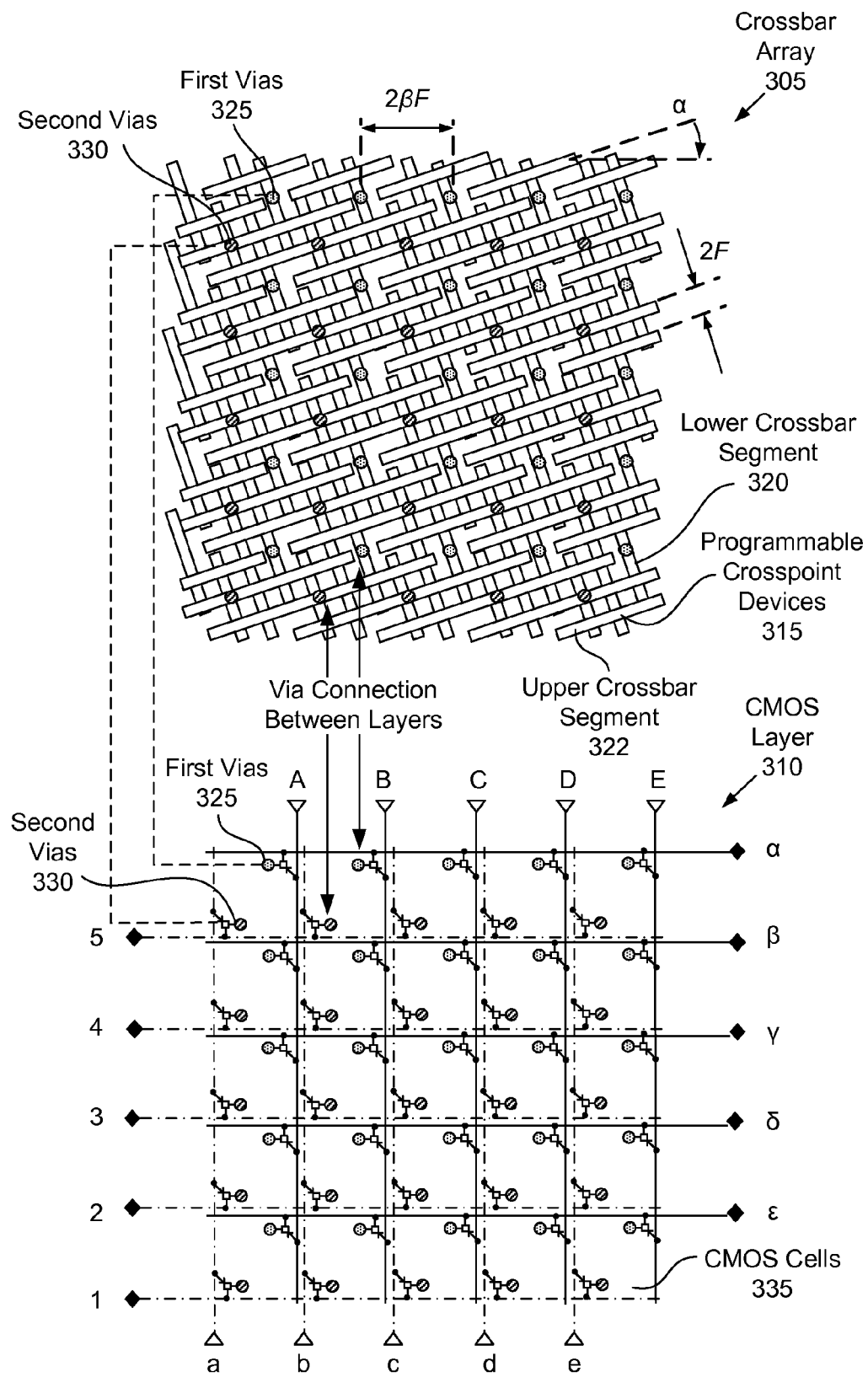
FIG. 3B is a diagram showing one illustrative integration scheme for interconnecting the CMOS layer and the overlying crossbar array, according to one embodiment of principles described herein.

FIG. 3B is a diagram showing one illustrative integration scheme for interconnecting the CMOS layer (310) and the overlying crossbar array (305). The CMOS layer (310) is made up of a number of CMOS cells (335). Each cell (335) contains a first via (325) and a second via (330). The CMOS cell (335) includes two access devices, one for each via in the cell. Four sets of lines provide input, output, and control functionality. For example, the set of first vias (325) are accessed by activating control lines labeled with uppercase Roman letters. Data is input and output from the set of first vias (325) using the input/output lines labeled with lowercase Greek letters. Similarly, the set of second vias (330) are accessed by activating control lines labeled with lowercase Roman letters and data is input/output using lines labeled with Arabic numerals. Lines associated with the set of second vias (330) are illustrated as dash-dot lines to distinguish them from the solid lines associated with the first vias (325).

The combined CMOS cells (335) create an array of vias which is divided into two distinct sets of vias, a set of first vias (325) and a set of second vias (330). The array of vias pass from the CMOS layer (310) upward into the crossbar array (305) where each via (325, 330) is electrically connected to a crossbar segment (320, 322). According to one illustrative embodiment, the set of first vias (325) are connected to the lower crossbar segments (320) at the mid-point of each segment. Similarly, the set of second vias (330) are connected to the upper crossbar segments (322) at the mid-point of each segment. A programmable crosspoint device (315) is located at each intersection between an upper crossbar segment (322) and a lower crossbar segment (320).

The pitch between the crossbar segments in the same crossbar array can be as dense as 2F, where F is the minimum feature size for the process which is used to form the segments. For example, in photolithography the minimum feature size is in the tens of nanometers. According to one illustrative embodiment, the spacing between vias of the same type is approximately $2\beta F$. This corresponds to the linear size of the underlying CMOS cell. Here $\beta$ is a dimensionless number larger than 1 that depends on the cell complexity in the CMOS subsystem. The crossbar segments are rotated by angle $\alpha = \arcsin(1/\beta)$ relative to the via array such that the vias naturally divide wires into crossbar segments of the length $\beta^2 2F$. Note that factor $\beta$ is not arbitrary but rather chosen from the spectrum of possible values $\beta = (r^2+1)^{1/2}$, where r is an integer so that the precise number of devices on the wire fragment is $r^2-1 \approx \beta^2$. According to one illustrative embodiment, the domain size in each crossbar array is proportional to the square of the quotient of the linear size of the CMOS cell divided by the crossbar wire pitch. For example, the linear size of the CMOS cell may be $2\beta F$ and the crossbar wire pitch may be 2F. Consequently, the domain size may be given by Eq. 1 below.

$$\text{Domain\_size} \propto \left(\frac{2\beta F}{2F}\right)^2 \qquad \text{Eq. 1}$$

Figure 3C:
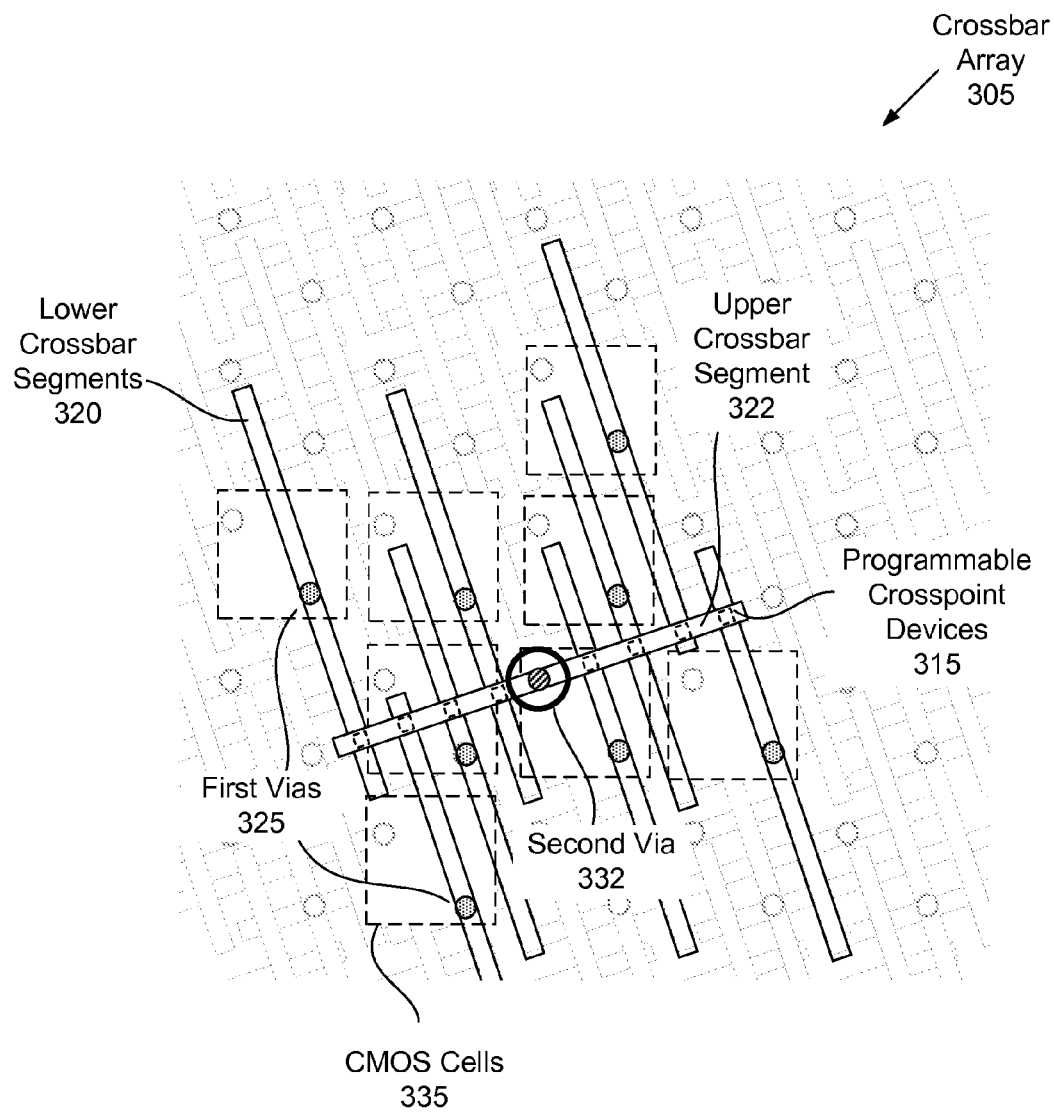
FIG. 3C is a diagram which shows one illustrative embodiment of a segmented crossbar array, according to one embodiment of principles described herein.

FIG. 3C is a diagram which shows one illustrative construction for addressing the programmable crosspoint devices (315). For clarity of illustration, a selected portion of the crossbar array (305) has been drawn with darker lines. This darkened portion contains eight lower crossbar elements (320) and one upper crossbar segment (322). The upper cross bar segment (322) is connected to a second via (332) and intersects eight lower crossbar segments (320). Each lower crossbar segment is connected to a corresponding first via (325). As discussed above, a programmable crosspoint device (315) is located at each intersection between upper and lower crossbar segments (322, 320). The access memory elements (315) are illustrated as dashed rectangles at each intersection between the upper crossbar segment (322) and the lower crossbar segments (320).

The darkened portion represents a single connectivity domain. This connectivity domain allows the eight programmable crosspoint devices (315) to be addressed using eight first vias (325) and a single second via (332). The corresponding CMOS cells (335) which underlie the crossbar array (305) have been shown as large dashed squares, each of which contains circuitry to access one first via and one second via.

As used in the specification and appended claims, the term "connectivity domain" refers to a set or group of conductive elements within a crossbar array which mutually interact to address one or more memory elements within the crossbar array. For example, in FIG. 3C the connectivity domain includes the second via (332) and all crossbar segments and first vias which are used to address the memory elements (315) which underlie the upper crossbar segment (322).

The relative scales of the components within the multilayer circuit have been altered for purposes of illustration. In particular, the crossbar segments (320, 322) are proportionally much smaller than the CMOS cells (335). According to one illustrative embodiment, the crossbar array (305) is made up of nanowire segments with minimum feature sizes between approximately 5-50 nanometers. In this configuration, one CMOS cell (335) may have 50 to 200 intersections overlying it. As shown in FIG. 3C, the density of the programmable crosspoint devices (315) is interrupted only where a via extends into the crossbar array. Consequently, for a CMOS cell which has 50 to 200 intersections, the space lost to via overhead could be as small as one to two percent. Because of the multilayer circuitry configuration, density of CMOS access circuitry does not necessarily match the pitch of the crossbar segments. For example, the angle of the crossbar segments in the crossbar array allows for density of the CMOS access circuitry to be significantly lower than the pitch of the crossbar segments.

The addressing of a particular programmable crosspoint device (315) lying along the upper crossbar segment (322) can be performed by activating the second via (332) using the CMOS cell (335) which directly underlies the second via (332). One of the eight first vias (325) is also actuated using the associated CMOS cell (335). This will provide access to the programmable crosspoint device (315) at the intersection of the upper crossbar segment (322) and the selected lower crossbar segment (320). The programmable crosspoint device (315) can then be programmed or read.

One advantage of a connectivity domain which contains a limited size and number of programmable crosspoint devices (315) includes reducing the leakage current through other elements. Leakage currents are undesirable flows of electricity which pass through programmable crosspoint devices (315) other than the element which is currently being read. These leakage currents can obscure the state of the target element during reading and increase the overall power consumption of the device.

These connectivity domains are repeated across the crossbar array such that each programmable crosspoint device (315) can be uniquely addressed with the proper activation of a first via and a second via. This method of repeating connectivity domains of limited size across a crossbar array can be very scalable. The size of the crossbar array can be increased by simply adding more connectivity domains rather than increasing wire lengths or changing the addressing technique. Consequently, the electrical characteristics and addressing of the crossbar array can be relatively independent of the crossbar array size.

For increased density and/or to decrease the planar size of the integrated circuit, additional crossbar arrays could be added above the first crossbar array (305). The integration of these additional crossbar arrays presents a number of challenges. For example, using conventional addressing techniques, separate vias must be connected to each individual crossbar segment and additional CMOS circuitry must be formed under the multiple crossbar arrays. For example, in a multilayer circuit with 40 crossbar arrays, it would be expected that all the vias for addressing all the crossbar arrays would pass through the bottom crossbar array. Consequently, the bottom crossbar array would have 40 times more vias that the upper most crossbar array and the density of the programmable crosspoint devices (315) would suffer in the bottom layers. Additionally, the overall density of the multilayer circuit could suffer because of the large number of CMOS cells which are formed to uniquely address each memory element. An additional concern is that each layer would be different and require a unique set of tooling (such as masks for a photolithographic process) for each crossbar arrays. This may significantly increase manufacturing complexity, yield, and cost.

Figure 4:
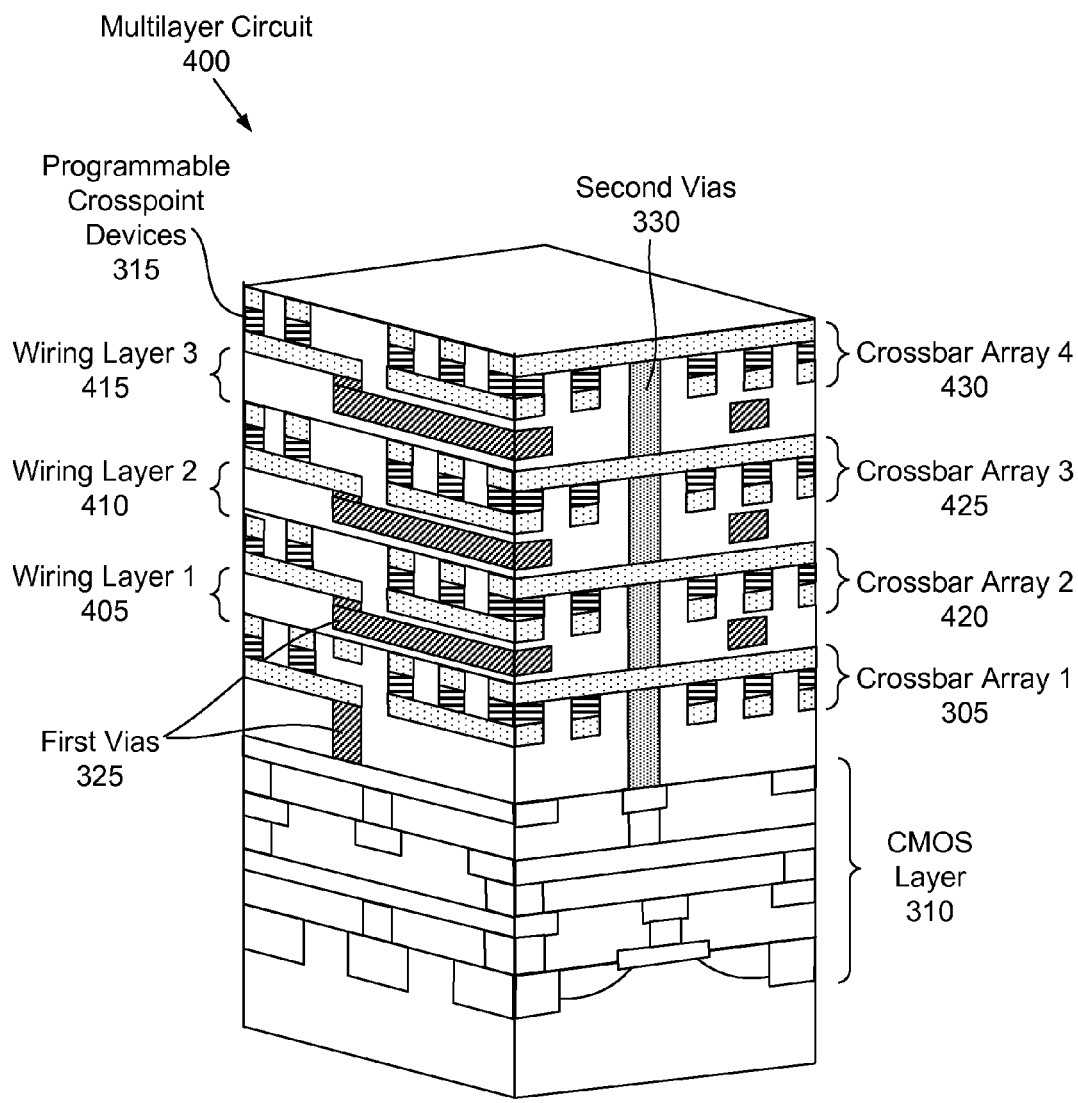
FIG. 4 is cross-sectional diagram of an illustrative multilayer circuit which includes a CMOS layer and multiple crossbar arrays, according to one embodiment of principles described herein.

However, by shifting connectivity domains between crossbar arrays, it has been discovered that multiple crossbar arrays can be uniquely addressed without the need for a greater number of CMOS cells or for additional vias. FIG. 4 is cross-sectional diagram of an illustrative multilayer circuit (400) which includes a CMOS layer (310) and multiple crossbar arrays (305, 420, 425, 430). According to one illustrative embodiment, a number of wiring layers (405, 410, 415) are interposed between successive crossbar arrays (305, 420, 425, 430). The second vias (330) pass through all the crossbar arrays (305, 420, 425, 430) and wiring layers (405, 410, 415) as a vertical column. In contrast, the locations of the first vias (325) are shifted in each successive wiring layer (405, 410, 415). This allows a set of first vias (325) which participate in addressing programmable crosspoint devices (315) along a first upper crossbar segment (322, FIG. 3C) to be used in addressing a different set of programmable crosspoint devices in the overlying crossbar array.

According to one illustrative embodiment, the programmable crosspoint devices (315) may be memristive junctions. Memristive junctions include a memristive matrix which is interposed between intersecting crossbar segments. The characteristics of these memristive junctions may vary between crossbar arrays. For example, a crossbar array 1 (305) may have memristive junctions with one particular matrix/dopant combination and crossbar array 2 (420) may have a different matrix/dopant combination.

Illustrative examples of suitable memristive matrix materials and dopants are given in Table 1, below. The table lists compatible primary materials, secondary materials, and dopant species for each memristive combinations. The primary material is typically a highly insulating stoichiometric compound. The secondary material is the source of the doping species for the primary material.

TABLE 1

List of Examples of Compatible Primary and Secondary Materials and Dopant Species

| Primary Material | Secondary Material | Dopant Species |
| --- | --- | --- |
| $TiO_2$ | $TiO_{2-x}$ | Oxygen Vacancies |
| $ZrO_2$ | $ZrO_{2-x}$ | Oxygen Vacancies |
| $HfO_2$ | $HfO_{2-x}$ | Oxygen Vacancies |
| $SrTiO_3$ | $SrTiO_{3-x}$ | Oxygen Vacancies |
| GaN | $GaN_{1-x}$ | Nitrogen Vacancies |
| CuCl | $CuCl_{1-x}$ | Chlorine Vacancies |
| GaN | GaN:S | Sulfide Ions |

Varying the matrix/dopant combination between crossbar arrays can provide a number of benefits. According to one illustrative embodiment, the multilayer circuit (400) is used to form a neural network. The CMOS layer (310) can analogous to a biological soma; the vias, crossbar segments, and other wired connections can be analogous to the dendrites and axons; and the memristive junctions can be analogous to the nerve synapses. Like the biological synapses, the memristive junctions can form selective connections which are sensitive to present and past conditions. To more accurately model a biological system, it can be desirable to have several different types of memristive junctions which are more or less sensitive to outside stimulus. For example, in a crossbar array 1 (305)

the memristive junctions may use a titanium dioxide matrix with oxygen vacancy dopants. In a crossbar array 2 (420) the memristive junctions may use a strontium titanate matrix with oxygen vacancy dopants. The motion of the dopants within two different matrices will be different and provide varying responses to programming or reading voltages.

Additionally or alternatively, the form of a particular matrix material may be varied within a crossbar array or between crossbar arrays. For example, a more crystalline form of the matrix material may be used in one location while a more amorphous form of the matrix material may be used in another location. The motion of dopants, in general, tends to be more restricted in crystalline matrices and more facile in amorphous matrices Other elements within the memristive junctions could also change between or within the crossbar arrays. For example, different species of mobile ions and/or different electrode materials with different work functions can be incorporated to increase functionality and flexibility of the multilayer circuit.

Advantages of crossbar architectures which incorporate memristive junctions include simplicity of construction, high density as a result of minimum feature sizes, stable memory for extended period of time, and other advantages.

Figure 5A:
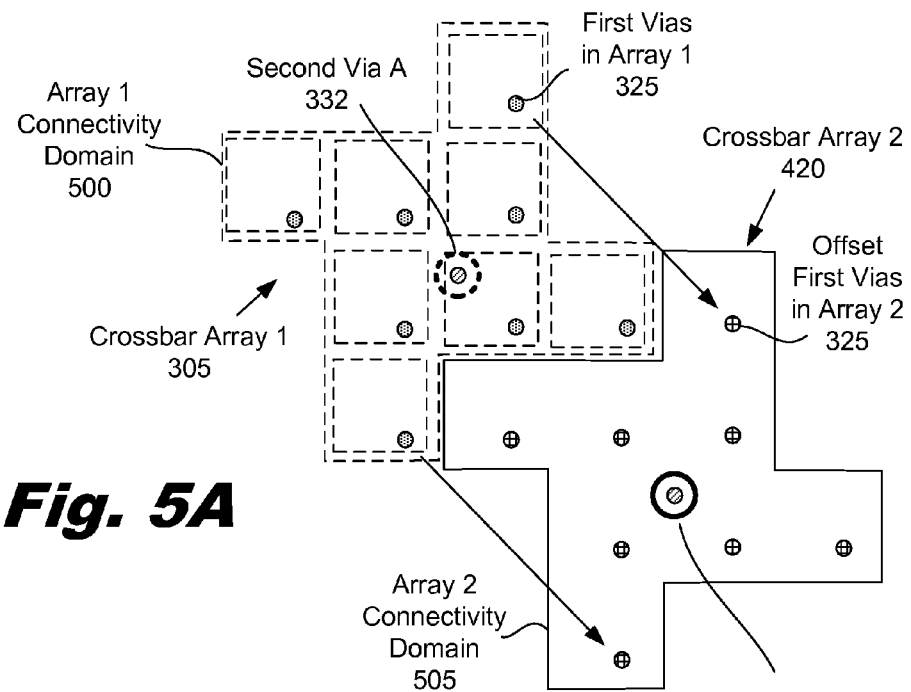
FIG. 5A is a diagram showing an offset of a connectivity domain to provide unique addressing to an overlying crossbar array, according to one embodiment of principles described herein.

FIG. 5A is a diagram showing an offset of a group of first vias (325) to provide unique addressing in an overlying crossbar array. In a crossbar array 1 (305) the eight first vias (325) provide addressing in conjunction with a second via (332). In a wiring layer, the group of first vias (325) is offset to provide addressing in conjunction with a different second via (334). In crossbar array 2 (420) the first vias (325) connect to a different set of lower crossbar segments which intersect with a different upper crossbar segment. Consequently, to address a programmable crosspoint device associated with second via A (332), the second via A (332) would be activated and one of the eight first via (325) would be activated. In crossbar array 2 (420), the first vias (325) are used to address programmable crosspoint devices associated with second via B (334).

By offsetting the first vias (325) between crossbar arrays, no additional vias are required to address overlying crossbar arrays. For example, the number of first and second vias remains the same whether there are 2 crossbar arrays or 30 crossbar arrays. Additionally, the offset in the wiring layers provides unique access to each programmable crosspoint devices using a combination of only one first via and one second via. This allows the CMOS access circuitry to remain simple and compact. Further, this design can be used with access algorithms which are very similar to existing field programmable gate array (FPGA) access algorithms. According to one illustrative embodiment, the traces (510) are substantially uniform in size and geometry over the entire wiring layer. Further, the layout of the wiring layer and crossbar array may be substantially uniform from layer to layer. This provides a significant cost savings in manufacturing the multilayer circuits because only one set of tooling (such as masks, nanoimprint patterns, etc.) needs to be constructed to form a multilayer circuit with an arbitrarily large number of crossbar arrays.

Figure 5B:
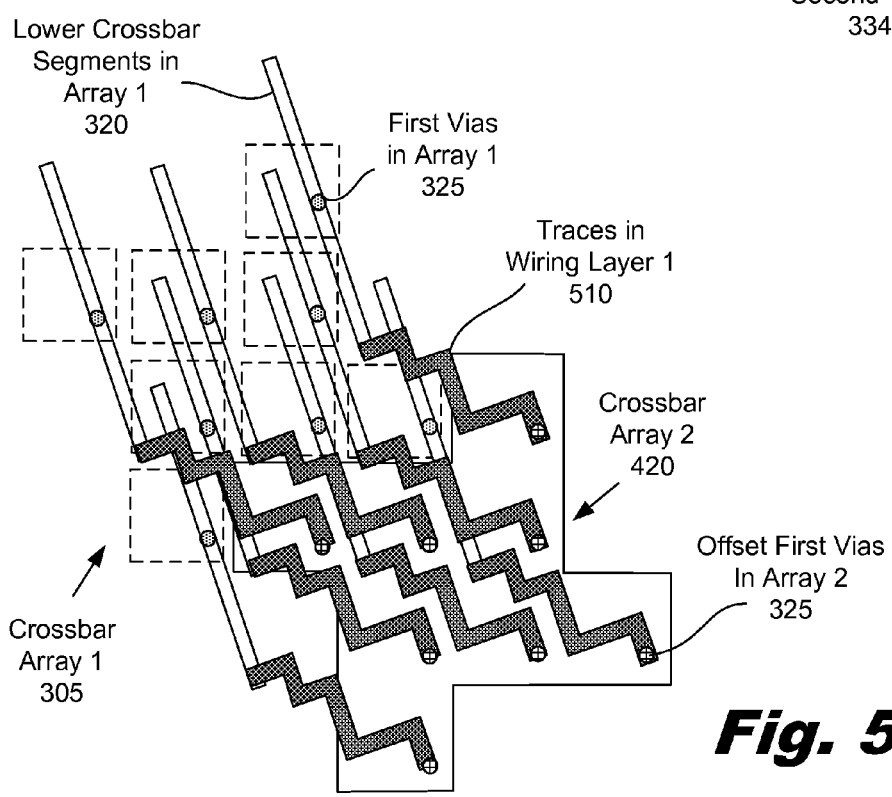
FIG. 5B is a diagram showing one illustrative embodiment of a wiring layer for offsetting a connectivity domain to provide unique addressing to an overlying crossbar array, according to one embodiment of principles described herein.

FIG. 5B is a diagram showing one illustrative embodiment of a wiring layer for offsetting a first via (325) group to provide unique addressing to an overlying crossbar array. A number of traces (510) connect to the end of each of the lower crossbar segments in crossbar array 1 (320). The traces then connect to a new group of offset lower crossbar segments in crossbar array 2 (420).

Figure 6:
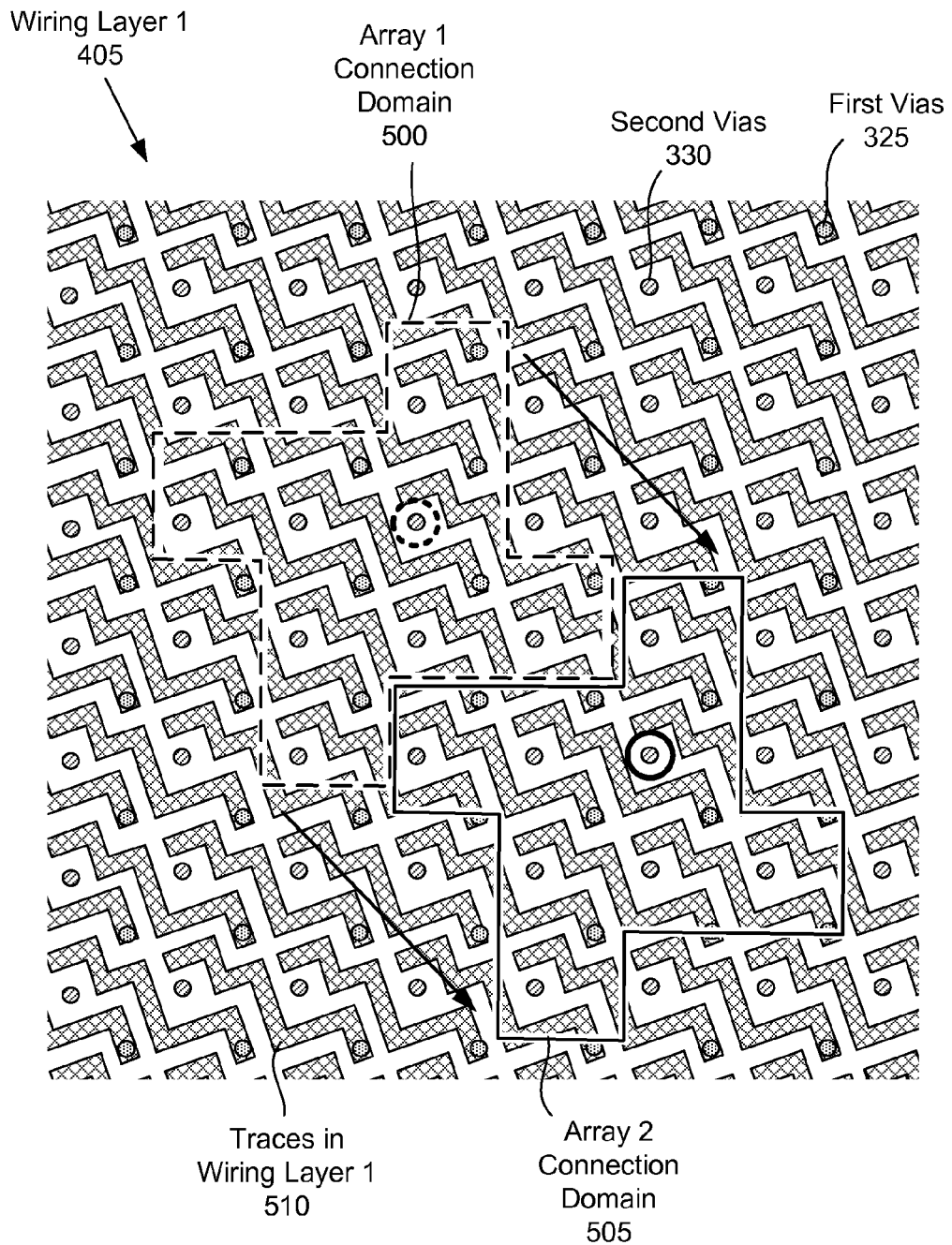
FIG. 6 is a diagram of an illustrative wiring layer, according to one illustrative embodiment of principles described herein.

FIG. 6 is a diagram of a portion of an illustrative wiring layer 1 (405). As described above, the wiring layer 1 (405) maps a crossbar array 1 connectivity domain (500) to an offset crossbar array 2 connection domain (505) as shown by the dark arrows. The wiring layer (405) includes a number of identical traces (510) which offset the entire set of first vias to new and offset locations. In this pairs the first vias with different second vias and provides for unique access to programmable crosspoint device in crossbar array 2.

According to one illustrative embodiment, the traces (510) have an orthogonal shape which does not interfere with areas where the second vias extend through the wiring layer (405). The orthogonal shape of the traces accommodates optical lithography processes and can facilitate the manufacturing process. The traces may have other shapes including curved or rectilinear geometries. Because the traces do not interfere with the second vias, the second vias can continue in a columnar fashion through the various layers.

Figure 7:
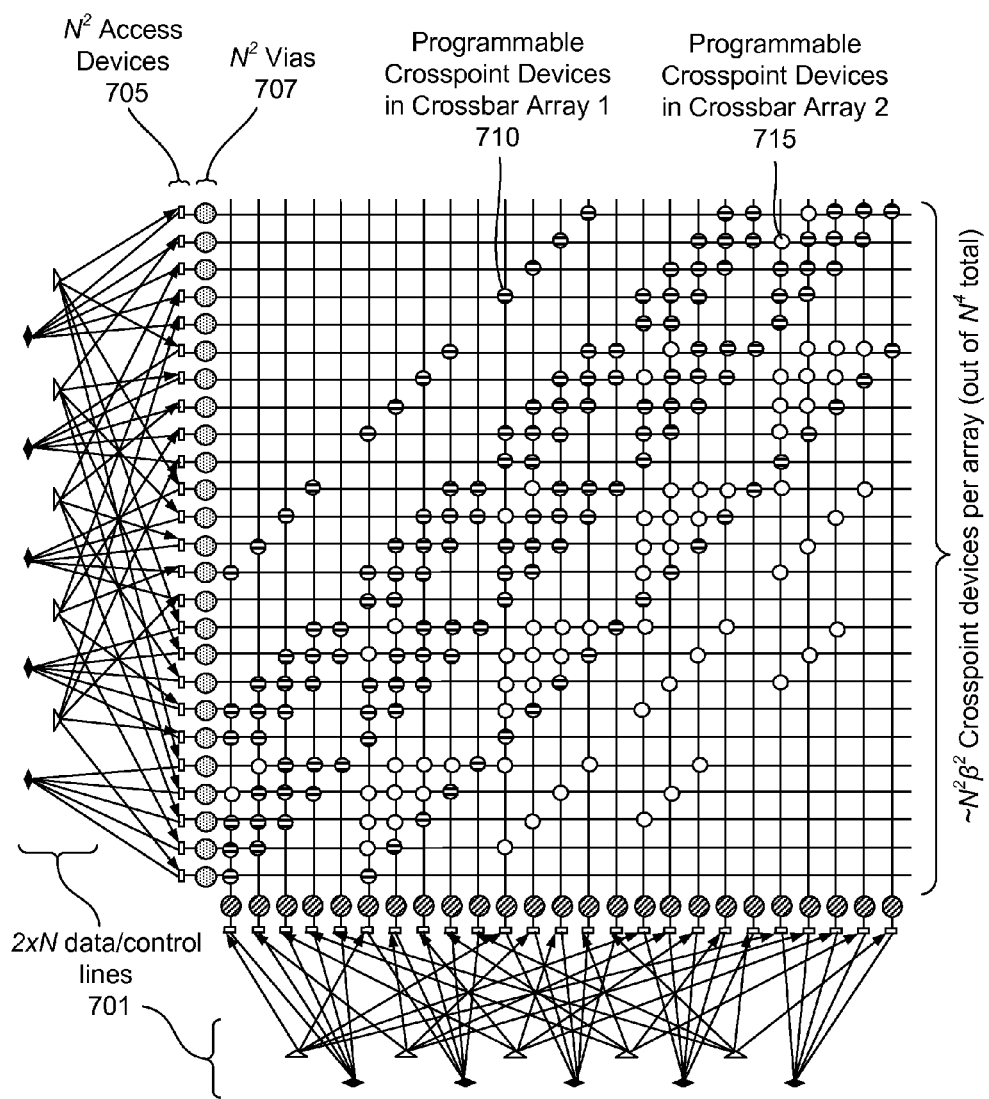
FIG. 7 is a schematic diagram of connections and access to crossbar nodes within a multilevel integrated circuit, according to one illustrative embodiment of principles described herein.

FIG. 7 is a schematic diagram of connections and access to memory addresses within a virtual (or logical) crossbar with $N^2 \times N^2$ cells that contains all of the real crossbars, each containing $\beta^2 N^2$ physical memory cells, in the multilevel integrated circuit. One set of 2×N data/control lines (701) addresses access devices (705) contained within the CMOS layer (310, FIG. 4), and another set of 2×N data/control lines addresses the second group of $N^2$ access devices. The two groups of $N^2$ vias (707) (one for bottom wire segments and the other for top wire segments in the stacked crossbars) originate in the CMOS layer (310, FIG. 4) and are selected by using the two sets of 2×N data/control lines (705). The via (707) connectivity through the multilayer structure is shown as a horizontal or vertical line which extends from each via. At various intersections between the horizontal and vertical lines of the diagram, a circle illustrates the presence of a physical cell or programmable crosspoint device. The programmable crosspoint devices (710) which are contained within crossbar array 1 are illustrated with horizontal lines inside the circle and the programmable crosspoint devices (715) which are contained within crossbar array 2 are open circles.

The theoretical maximum number of layers M that can be stacked and still have all of the cells in every layer be uniquely addressed is $M=N^2/\beta^2$. This makes possible the addressing of a very large number of layers and thus a huge area density of cells that can be addressed. For example, if N is 1024 and $\beta$ is 32, M is 1024. For realistic values of N and $\beta$, this scheme can uniquely address each cell in over 1000 crossbar arrays, and still have a large number of addresses that are never used. This produces the theoretical possibility of creating a memory/storage device that has a bit density as high as petabits ($10^{15}$) per square centimeter. Practically, this number will be smaller and the number of layers that can be addressed will be limited because of the crosspoint devices lost due to edge effects.

As shown in FIG. 7, there can be a significant amount of excess address space. This excess address space is approximately the difference between the available addressing locations ($N^4$) and the total number of addressing location used by the crosspoint devices (crosspoint layers×$\beta^2 N^2$). According to one illustrative embodiment, this excess address space could be used for error, defect and fault protection.

Figure 8:
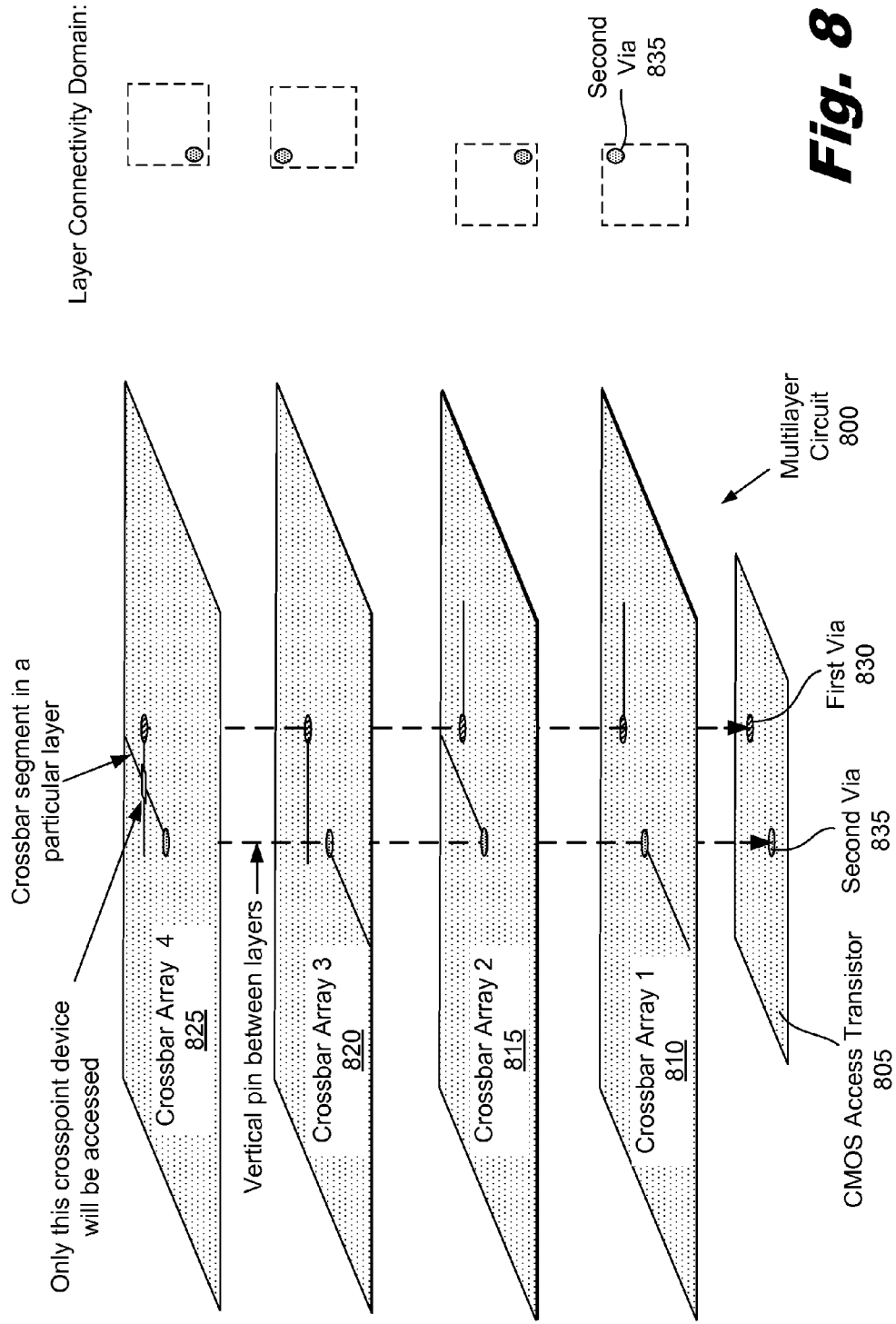
FIG. 8 is a diagram of an illustrative integrated circuit with four crossbar arrays, according to one illustrative embodiment of principles described herein.

FIG. 8 is a diagram of an illustrative multilayer circuit (800) with four crossbar arrays (810, 815, 820, 825). A CMOS access transistor (805) is at the base of the multilayer circuit (800). The CMOS access transistor (805) provides selective access to a first via (830) and a second via (835). The vias (830, 835) extend straight up through the crossbar arrays (810, 815, 820, 825).

According to one illustrative embodiment, this multilayer circuit (800) can be constructed without wiring layers while still uniquely addressing each memory element. This is accomplished by changing the connectivity domain in each layer such that all devices are accessed uniquely. For example, in Layer 1 (810), the crossbar segment attached to the second via (835) may extend in forward direction to intersect with a first set of perpendicular crossbar segments. In the next layer, the second via (835) may extend in a backward direction to intersect with a second set of perpendicular crossbar segments, and so forth. Similarly, the extension direction of the crossbar segment attached to the first via (830) can be altered to connect with various sets of perpendicular crossbar segments for unique addressing of the programmable crosspoint device. On the right side of FIG. 8, a series of dashed boxes show the connectivity domain for each layer.

Figure 9:
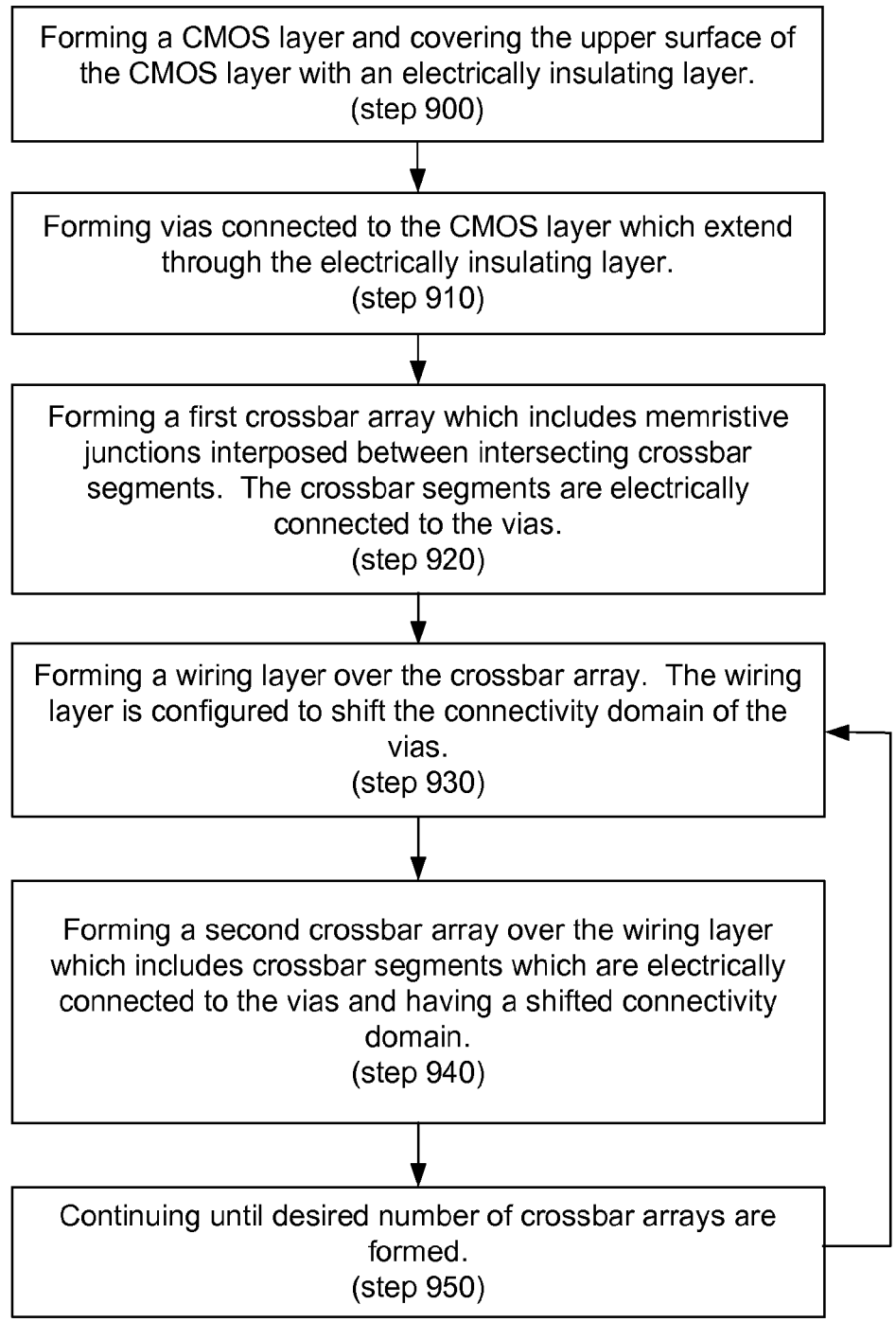
FIG. 9 is a diagram of one illustrative method for constructing a multilayer integrated circuit, according to one illustrative embodiment of principles described herein.

FIG. 9 is a diagram of one illustrative method for constructing a multilayer integrated circuit. According to one illustrative embodiment, the method includes forming a CMOS layer and covering the upper surface of the CMOS layer with a passivating/electrically insulating layer (step 900). A number of vias are connected to the CMOS layer and extend through the electrically insulating layer (step 910). These vias provide electrical access to the underlying CMOS layer. A first crossbar array is then formed. According to one illustrative embodiment, the crossbar array includes memristive junctions which are interposed between intersecting crossbar segments. These crossbar segments are electrically connected to the vias (step 920). A wiring layer is then formed over the first crossbar array. The wiring layer shifts the connectivity domain of the vias by offsetting a group of first vias while allowing a group of second vias to pass vertically through the wiring layer (step 930). A second crossbar array is formed over the wiring layer and the crossbar segments within the second crossbar array are electrically connected to the vias emerging from the wiring layer. This forms connectivity domains in the second crossbar array which are shifted with respect to the connectivity domains in the first crossbar array (step 940). This process can be repeated by continuing to form wiring layers and crossbar arrays until the desired circuit is formed (step 950).

The three dimensional multilayer circuit described above could be used in a variety of applications. For example, the multilayer circuit could be used a very high density memory which replaces Dynamic Random Access Memory for computing applications; incorporated into a high density portable storage device that replaces flash memory and other removable storage devices for cell phones, cameras, net book and other portable applications; a very high density storage medium to replace magnetic hard disks and other forms of permanent or semi-permanent storage of digital data; and/or a very high density cache or other memory integrated on top of a computer processor chip to replace Static Random Access Memory.

In sum, the three dimensional multilayer circuit described above is a hybrid of CMOS circuitry and crossbar arrays which provides higher density in digital memories, dramatically improves the density of field programmable logic, and has significant applications in bio-inspired adaptive circuitry. By interposing a lateral wiring layer between crossbars, it is possible to laterally shift the connecting points to a set of vias, thus enabling access to all connectivity domains in every crossbar array. The via offset technique can be used to integrate any number of crossbar arrays. For a limited number of layers, the connectivity domains can be shifted by utilizing symmetry operations without any intermediate wiring layers.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A three dimensional multilayer circuit comprising:
a via array comprising a set of first vias and a set of second vias;
an area distributed CMOS layer configured to selectively address the set of first vias and the set of second vias;
at least two crossbar arrays configured to overlie the area distributed CMOS layer, each of the at least two crossbar arrays comprising a plurality of intersecting crossbar segments; and
programmable crosspoint devices configured to be interposed between the intersecting crossbar segments, the via array being connected to the crossbar segments such that each of the programmable crosspoint devices can be uniquely accessed using a first via and a second via.

2. The circuit according to claim 1, further comprising an interposed wiring layer configured to offset a connectivity domain of the set of first vias between successive crossbar arrays.

3. The circuit according to claim 2, in which a first connectivity domain in a first crossbar array is offset by the wiring layer such that a second connectivity domain in a second crossbar array is adjacent to, but does not overlap, the first connectivity domain.

4. The circuit according to claim 2, in which the wiring layer comprises traces which have orthogonal routing, a first end of each trace being configured to attach to a first end of a crossbar segment in a first crossbar array and a second end of each trace is attached to a via extending upward into a second crossbar array.

5. The circuit according to claim 2, further comprising multiple wiring layers, a layout of the multiple wiring layers being substantially uniform for each wiring layer; and the layout of the at least two crossbar arrays are substantially uniform for each crossbar array.

6. The circuit according to claim 1, in which otherwise identical crossbar arrays are stacked upon each other using symmetry operations to enable fixed location vias to uniquely address every crosspoint device in each of the crossbar arrays.

7. The circuit according to claim 1, in which a fixed group of first vias access programmable crosspoint devices connected to a second via in a first crossbar array and the same fixed group of first vias are configured to access programmable crosspoint devices connected to a different second via in a second crossbar array.

8. The circuit according to claim 1, in which the programmable crosspoint devices are memristive junctions.

9. The circuit according to claim 8, in which a composition of the memristive junctions varies between the at least two crossbar arrays.

10. The circuit according to claim 1, in which the programmable crosspoint devices within the at least two crossbar arrays are configured to selectively connect underlying CMOS circuit elements to create a field programmable circuit.

11. The circuit according to claim 1, in which the set of second vias are configured to form electrically conductive columns which pass vertically through layers of the three dimensional multilayer circuit.

12. The circuit according to claim 1, in which a connectivity domain size in each crossbar array is proportional to the square of the quotient of a linear size of the CMOS cell divided by the crossbar wire pitch.

13. The circuit according to claim 1, in which the density of CMOS access circuitry does not match the pitch of the crossbar segments.

14. The circuit according to claim 1, in which a number of vias in the via array does not increase as a number of crossbar arrays in the three dimensional multilayer circuit increases, in which connectivity domains in each of the crossbar arrays are unique.

15. A method for constructing a multilayer circuit comprising:
- forming a CMOS layer, the upper surface of the CMOS layer being covered by an electrically insulating layer;
- forming vias connected to the CMOS layer which extend through the electrically insulating layer;
- forming a first crossbar array, the first crossbar array comprising memristive junctions interposed between intersecting crossbar segments, the crossbar segments being electrically connected to the vias;
- forming a wiring layer over the first crossbar array, the wiring layer being configured to shift a connectivity domain of the vias;
- forming a second crossbar array over the wiring layer, the second crossbar array comprising intersecting crossbar segments, the crossbar segments being electrically connected to the vias and having a shifted connectivity domain.

\* \* \* \* \*